United States Patent

[11] 3,562,592

[72] Inventors Reginald Bejamin William Cooke
Bishop's,Stortford;
Francis Brian Robinson, Cuffley; Peter
Ernest Radley, Walden, Essex, England
[21] Appl. No. 819,071
[22] Filed Apr. 24, 1969
[45] Patented Feb. 9, 1971
[73] Assignee International Standard Electric
Corporation
New York, N.Y.
a corporation of Delaware
[32] Priority May 7, 1968
[33] Great Britain
[31] 21470

[54] CIRCUIT ASSEMBLY
9 Claims, 2 Drawing Figs.

[52] U.S. Cl. .......... 317/101, 174/68.5
[51] Int. Cl. .......... H05k 1/04
[50] Field of Search .......... 317/101B, 101A, 101, 101CX, 101CP; 174/685, FP

[56] References Cited
UNITED STATES PATENTS

| | | | |
|---|---|---|---|
| 3,312,871 | 4/1967 | Seki et al. | 317/101A(UX) |
| 3,372,310 | 3/1968 | Kantor | 317/101CP(UX) |
| 3,474,297 | 10/1969 | Bylander | 317/101CC(UX) |
| 3,496,419 | 2/1970 | Sakellakis | 174/68.5 |
| 3,501,582 | 3/1970 | Heidler et al. | 317/101C(UX) |

*Primary Examiner*—David Smith, Jr.
*Attorneys*—C. Cornell Remsen, Jr., Walter J. Baum, Paul W. Hemminger, Percy P. Lantzy, Philip M. Bolton, Isidore Togut and Charles L. Johnson, Jr.

ABSTRACT: This is a hybrid integrated circuit assembly with an insulating substrate having two sets of conductive or resistive tracks disposed on both sides of integrated circuit chips. The interconnections between the chips and the tracks are kept orderly and short by running at right angles to the tracks. By placing edges of the chips at 45° to the tracks, there is no crossover problem for the interconnections.

Inventors
REGINALD B. W. COOKE
FRANCIS B. ROBINSON
PETER E. RADLEY
By [signature]
Attorney Inventors
REGINALD B. W. COOKE
FRANCIS B. ROBINSON
PETER E. RADLEY
By [signature]
Attorney

CIRCUIT ASSEMBLY

BACKGROUND OF THE INVENTION

This invention relates to electric circuit assemblies.

SUMMARY OF THE INVENTION

According to the invention there is provided an electric circuit assembly comprising an insulating substrate having on one major surface thereof two spaced parallel sets of parallel continuous and/or interrupted 'printed' conductors, a plurality of individual integrated circuit chips spaced along and mounted on the substrate in the space between the said two sets of 'printed' conductors, and wires interconnecting the integrated circuit chips and the said 'printed' conductors and extending at right angles to the direction of the 'printed' conductors.

DESCRIPTION OF THE PREFERRED EMBODIMENT

Figure 1:
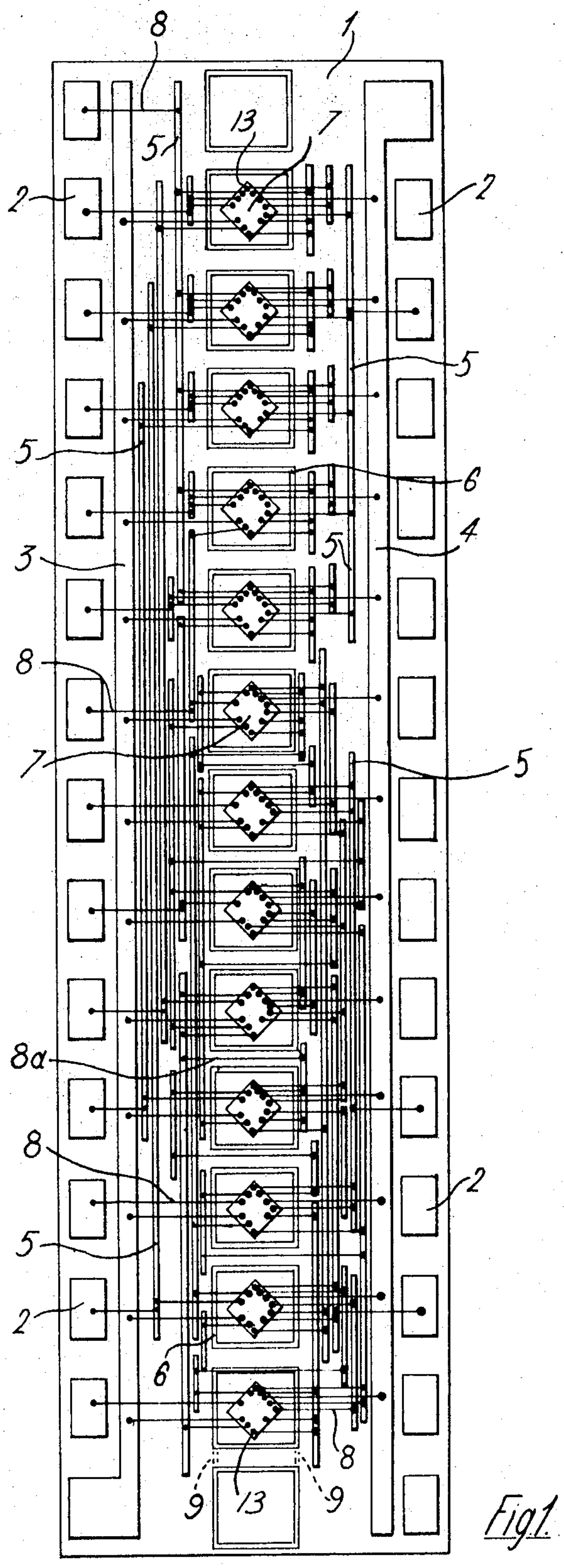
FIG. 1 is a plan view of an electric circuit assembly.

Referring to FIG. 1, an insulating substrate 1, of glass, measuring 1.5 inches long × 0.4 inches wide × 0.020 inches thick, has on one major surface thereof various arrays of 'printed' conductors. 'Printed' is defined as those conductors (or resistors) which are bonded, affixed, deposited or otherwise produced as conducting (or resistive) tracks on the substrate.

The printed conductors are provided, as shown in FIG. 1, to form an array of terminal areas or lands 2 adjacent to each longitudinal edge of the substrate, a power track 3, an earth track 4, and parallel interconnection tracks 5.

Between the two spaced parallel sets of interconnection and other tracks and terminal areas, are printed conductor frames 6 within each of which (apart from the two end frames 6) is an integrated circuit chip 7, 1 mm. square.

In this example, a substrate was used with two more frames 6 than the total number of circuit chips 7 required.

The circuit chips shown in this example are each triple three input gates, a total of 45 gates, but any chips, identical or dissimilar may of course be used.

There are a total of 30 terminal areas 2 on 0.1-inch pitch. This number can be readily altered to conform with any desired pitch.

The interconnection tracks 5 for the integrated circuit chips are 0.005 inches wide, spaced by 0.005 inches and are separately designed for length and position of different circuits.

The power and earth tracks 3 and 4 may be common for all substrate designs, as may the terminal areas 2.

The frames 6 assist in locating the integrated circuit chips 7 during assembly, and may also, as will be described later, provide a means of evading wire crossovers during wire bonding between the two sets of interconnection tracks.

In this example, the printed conductors were produced by mounting the substrate, already provided over one major surface thereof with an overall coating of nickel/chromium covered by a coating of gold, on a tape-controlled coordinately movable table which is incorporated in an equipment having a liquid-delivering stylus above the substrate.

An etch-resistant pattern is written by the stylus on the gold coating over the areas to form the various required conducting tracks, areas, and frames, and the substrate is then placed in a gold etching solution which removes the gold from the substrate except where protected by the etch resist pattern. The substrate is then placed in a nickel/chromium etching solution to remove the nickel/chromium coating exposed through removal of the gold. The required conductors remain, of gold on nickel/chromium. The resist pattern is subsequently removed.

Two control tapes are needed to produce the substrate. The first tape is for the standardized part of the substrate, and written with a stylus of 0.020 -inch line width. The second control tape is for the interconnection tracks required by the individual circuit, and written with a stylus of 0.005-inch line width.

The electrical contacts 13 on the surface of the integrated circuit chips are connected to the printed conductor tracks by 0.001-inch diameter aluminum wires 8 terminated by ultrasonic bonding. No lead is longer than 0.150 inches. It is important that the wires run straight from the chip lands to the substrate tracks, at right angles to the tracks. Any deviation from this usually results in bonding troubles which must be avoided in the case of bonding mechanization.

This is the reason for mounting the integrated circuit chips with the edges at 45° to the direction of the tracks on the substrate. This is clearly shown in FIG. 1.

A single file of chips, as shown in FIG. 1, presents the simplest problem of placement, occupying less than 2 minutes of computer time.

In FIG. 1 there are some wires, such as 8*a*, which strap directly between conductors one in each set. This could be avoided, if required, by arranging for a first wire from one conductor to be connected to an adjacent frame 6 and a second wire from the frame to the other conductor.

One or more of the frames may be interrupted to provide facility for use as the intermediate connection point of two or more wires.

Two or more of the frames themselves may be interconnected by providing a short length or lengths of printed conductor interconnecting the required frames, as indicated in dashed outline at 9.

The printed conductors may include a thin film printed resistor, resistors or resistor network in the interconnection pattern. A printed resistor, resistors, or resistor network may be included in the space between the two sets of printed conductors.

The resistors may be produced at the stage of forming the conductor with the stylus-writing equipment previously referred to, by arranging that after the etching away of the unwanted gold coating, the nickel/chromium coating is written thereon in the desired area or areas an etch resistant pattern corresponding to the required resistor pattern. Thus when the substrate is subjected to nickel/chromium etching, the resistors remain as a pattern or patterns of nickel/chromium.

Figure 2:
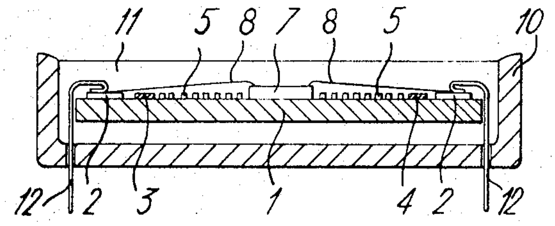
FIG. 2 is a sectioned view showing the assembly of FIG. 1 potted within a container.

As shown in FIG. 2, the circuit assembly of FIG. 1 may be placed within a container 10, with the circuit assembly surrounded by suitable potting materials 11. Prior to potting, terminal wires 12, typically of 0.010-inch diameter solder-covered nickel wire, are soldered as required to the terminal areas 2, and brought out through the bottom wall of the container and insulatingly sealed therethrough. Alternatively, the wires 12 may be brought out through the top free surface of the potting.

Instead of a glass substrate, with nickel/chromium and gold conductors, the use of a ceramic substrate with aluminum interconnection tracks would be more favorable with regard to heat dissipation, and would guard against the possibility of "-purple plague" on the gold tracks and aluminum wire joints, although this hazard is greatly reduced with ultrasonic bonding.

The circuit described can be directly compared to a printed circuit card with 15 dual-in-line packages mounted and wired. In general the wire bonds contained in the described circuit are the same in number that would ordinarily be included in the integrated circuit packages. Therefore, the connections in the circuit card are additional and not needed in the described circuit, a reduction of joints of perhaps 40 percent, a contribution to reliability.

We claim:

1. An electric circuit assembly comprising:

an insulating substrate having on one major surface thereof two spaced parallel sets of parallel continuous and interrupted printed conductors;

a plurality of individual integrated circuit chips spaced along and mounted on the substrate in the space between said two sets of printed conductors, all the edges of said chips being at an angle to the direction of said printed conductors, each of said chips having electrical contacts formed on a surface thereof, said contacts being adjacent each of the edges of said chips; and wires interconnecting said contacts and said printed conductors and extending at right angles to the direction of said printed conductors.

2. An electric circuit assembly as claimed in claim 1 in which the integrated circuit chips are mounted on the substrate with their edges at 45° to the direction of the printed conductors.

3. An electric circuit assembly as claimed in claim 1 in which each of said integrated circuit chips is surrounded by a frame of a printed conductor.

4. An electric circuit assembly as claimed in claim 3 in which at least some of the said frames are interconnected by a printed conductor.

5. An electric circuit assembly as claimed in claim 3 in which at least one of said frames is formed by an interrupted printed conductor.

6. An electric circuit assembly as claimed in claim 1 in which said integrated circuit chips are mounted in a straight line on said substrate.

7. An electric circuit assembly as claimed in claim 1 in which included on said substrate surface is a printed resistor or resistor network included in or connected to the printed conductors of one or both of said sets of conductors.

8. An electric circuit assembly as claimed in claim 1 in which each of the sets of printed conductors includes an array of terminal areas adjacent to an edge of the substrate.

9. An electric circuit assembly as claimed in claim 8 in which the substrate and all the components thereon is potted in a suitable container, with terminal wires for external connection extending from said terminal areas through the bottom wall of the container.